(12) United States Patent
Martinsson

(10) Patent No.: US 11,133,689 B2
(45) Date of Patent: Sep. 28, 2021

(54) BATTERY CHARGING SYSTEM AND METHOD

(71) Applicant: HUSQVARNA AB, Huskvarna (SE)

(72) Inventor: Pär Martinsson, Jönköping (SE)

(73) Assignee: HUSQVARNA AB, Huskvarna (SE)

( * ) Notice: Subject to any disclaimer, the term of this patent is extended or adjusted under 35 U.S.C. 154(b) by 196 days.

(21) Appl. No.: 16/349,366

(22) PCT Filed: Oct. 31, 2017

(86) PCT No.: PCT/EP2017/077869
§ 371 (c)(1),
(2) Date: May 13, 2019

(87) PCT Pub. No.: WO2018/091263
PCT Pub. Date: May 24, 2018

(65) Prior Publication Data
US 2019/0372370 A1 Dec. 5, 2019

(30) Foreign Application Priority Data
Nov. 17, 2016 (SE) .................................... 1651500-9

(51) Int. Cl.
*H02J 7/00* (2006.01)
*H02J 50/40* (2016.01)
(Continued)

(52) U.S. Cl.
CPC .......... *H02J 7/0047* (2013.01); *G01R 31/382* (2019.01); *H02J 7/0021* (2013.01);
(Continued)

(58) Field of Classification Search
CPC ..................................................... H02J 7/0047
(Continued)

(56) References Cited

U.S. PATENT DOCUMENTS 7,602,148 B2    10/2009  Deprun
8,427,101 B2     4/2013  Saunamaki
(Continued)

FOREIGN PATENT DOCUMENTS

CN        205178534 U     4/2016
EP        2 819 211 A1   12/2014
(Continued)

OTHER PUBLICATIONS

Search Report for Swedish Application No. 1651500-9 dated May 2, 2017.
(Continued)

*Primary Examiner* — Edward Tso
*Assistant Examiner* — Ahmed H Omar
(74) *Attorney, Agent, or Firm* — Burr & Forman, LLP

(57) ABSTRACT

The present disclosure relates to a method in a battery charging system (1), as well as such a system and arrangements used therein. The charging system (1) comprises at least a first (5) and a second (7) chargeable battery and a battery charger (9). At beginning of the charging of the first battery, timing data is collected (43) related to the charging of the first chargeable battery. The timing data is transmitted (45) the via a wireless interface to a remote circuit. The remote unit may set (49) a timing circuit based on the timing data, and communicates (51) an indication of remaining charging time to a user based on the timing circuit. This means that the user can be informed of the status of the first battery, even if remote therefrom.

18 Claims, 3 Drawing Sheets

(51) Int. Cl.
*G01R 31/382* (2019.01)
*H01M 10/42* (2006.01)

(52) U.S. Cl.
CPC ........ *H02J 7/00036* (2020.01); *H02J 7/0042* (2013.01); *H02J 50/40* (2016.02); *H01M 10/4257* (2013.01); *H02J 2207/40* (2020.01)

(58) Field of Classification Search
USPC ........................................................ 320/128
See application file for complete search history.

(56) References Cited

U.S. PATENT DOCUMENTS

| | | |
|---|---|---|
| 9,136,729 B2 | 9/2015 | Ashinghurst et al. |
| 9,263,775 B1 | 2/2016 | Lowchareonkul |
| 2007/0096691 A1 | 5/2007 | Duncan et al. |
| 2013/0063083 A1 | 3/2013 | Park et al. |
| 2013/0320989 A1 | 12/2013 | Inoue et al. |
| 2014/0119575 A1 | 5/2014 | Conrad et al. |
| 2014/0364173 A1* | 12/2014 | Tuli ........................ H02J 7/025 455/573 |
| 2015/0002089 A1 | 1/2015 | Rejman et al. |
| 2015/0042291 A1 | 2/2015 | Racine et al. |
| 2016/0254684 A1* | 9/2016 | Gothoskar ............ H02J 7/0027 455/572 |

FOREIGN PATENT DOCUMENTS

| | | |
|---|---|---|
| EP | 2 963 765 A1 | 1/2016 |
| JP | 2003288539 A | 10/2003 |
| KR | 101451395 B1 | 10/2014 |
| WO | 2011/043967 A2 | 4/2011 |

OTHER PUBLICATIONS

International Search Report and Written Opinion for International Application No. PCT1EP20171077869 dated Feb. 12, 2018.

* cited by examiner

BATTERY CHARGING SYSTEM AND METHOD

TECHNICAL FIELD

The present disclosure relates to a battery charging system, comprising at least a first chargeable battery and a battery charger. The present disclosure further relates to devices used in such a system as well as a method carried out in such a system.

BACKGROUND

Tools powered by chargeable batteries are widely used. Typically, a battery charging system includes a charger and two or more batteries, such that one battery can be used with the tool while the other is being charged. A general problem which such systems is to improve the efficiency with which they are used.

SUMMARY

One object of the present disclosure is therefore to provide a battery charging system that allows more efficient use. This object is achieved by means of a battery charging system as defined in claim 1. More specifically, in a system of the initially mentioned kind, a timing data acquisition circuit is provided, configured to be activated when the first chargeable battery is connected to the battery charger, obtaining timing data related to the charging of the first chargeable battery. Further, the system involves a transmitter configured to send said timing data via a wireless interface, and a remote unit comprising a receiver configured to wirelessly receive the timing data. A timer circuit may be configured to be set based on the timing data, and a communicator communicates an indication, corresponding to the remaining charging time needed to charge the first battery, to a user.

This arrangement allows the battery charging time to be estimated when the battery is connected, and the resulting information is conveyed to a remote unit which can communicate for instance an indication to the user that the first battery has been charged e.g. to 80%, even if the user at that time is way out of reach of the transmitter's range. The user, when provided with this information, can plan his work in a more efficient way, for instance deciding to return to the charger and swap batteries in case the presently used battery is about to run low.

The timing data acquisition circuit may be configured to estimate the remaining charging time needed to charge the first battery to a predetermined level, the transmitter sending timing data corresponding to said estimated time period. This means that a single parameter is sent, and that the remote unit need not estimate the remaining charging time.

The timing data acquisition circuit and the transmitter may be located in the first battery, while the receiver, an optional timer circuit and the communicator are located in a second battery. Typically, both the first and the second chargeable battery may comprise a timing data acquisition circuit, a transmitter, a receiver, a timer circuit and a communicator. This means that the desired functionality can be provided to a previously owned tool-charger combination, simply by purchasing new batteries, as all the new functionality can reside in the batteries.

Alternatively, the timing data acquisition circuit and the transmitter may be located in the first battery, while the receiver, the timer circuit and the communicator are located in a wireless device other than a second chargeable battery, such as for instance a smartphone.

The timing data acquisition circuit and the transmitter may alternatively be located in the charger. The remote unit may be included in a tool.

The transmitter and receiver may operate a short-range wireless interface in a group including: BLUETOOTH, ZIGBEE, and ANT+, although other short range interfaces are conceivable.

The indication of remaining charging time may be an indication that the first battery has reached the predetermined charging level, e.g. an alarm, or alternatively an indication when the first battery will reach the predetermined charging level or the remaining charging time.

The present disclosure further considers a device for use in such a battery charging system, wherein a timing data acquisition circuit is provided, configured to be activated when a first chargeable battery is connected to the battery charger, the timing data acquisition circuit collecting timing data related to the charging of the first chargeable battery, and a transmitter is provided sending timing data via a wireless interface.

The present disclosure additionally considers a device for use in such a battery charging system, wherein a receiver is provided, configured to receive timing data corresponding to a time period needed to charge a first battery to a predetermined level, together with an optional timer circuit configured to be set based on the timing data, and a communicator being configured to communicate an indication of remaining charging time to a user.

The present disclosure also considers a method in a battery charging system comprising at least a first and a second chargeable battery and a battery charger. The method involves connecting a first battery to a charger, collecting timing data related to the charging of the first chargeable battery, transmitting the timing data via a wireless interface, receiving via the wireless interface in a remote circuit, optionally setting a timing circuit in the remote unit based on the timing data, and communicating an indication of remaining charging time to a user based on the timing circuit. The communicating may take place when the remote unit has moved out of range of the wireless interface. It is further possible to set a tool parameter based on the received timing data.

DETAILED DESCRIPTION

Figure 1:
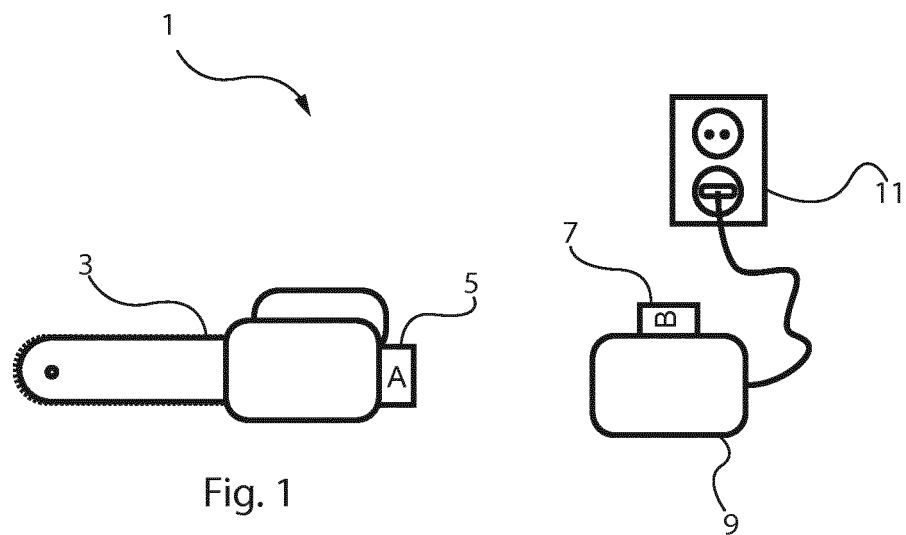
FIG. 1 illustrates a battery charging system.

The present disclosure relates to a battery charging system, components in that system, and a method carried out in such a system. FIG. 1 illustrates the system 1, comprising a tool, such as a battery powered chain saw 3. Needless to say, a great number of other tools are possible in this context, including leaf blowers, drilling machines, trimmers, hedge cutters, etc. In order to allow the efficient operation of the tool 3, the system 1 further includes a battery charger 9 and usually at least first 5 and second 7 chargeable batteries, which can be used connected to the tool 3 and charged connected to the charger 9. Typically, the batteries 5, 7 provide e.g. 18 or 36 V DC to the tool 3. The charger may be connected to a mains connection 11 (e.g. 220 V 50 Hz) to provide electric energy for charging. One object of the present disclosure is to provide a more efficient use of the tool and the batteries in a work situation.

Figure 2:
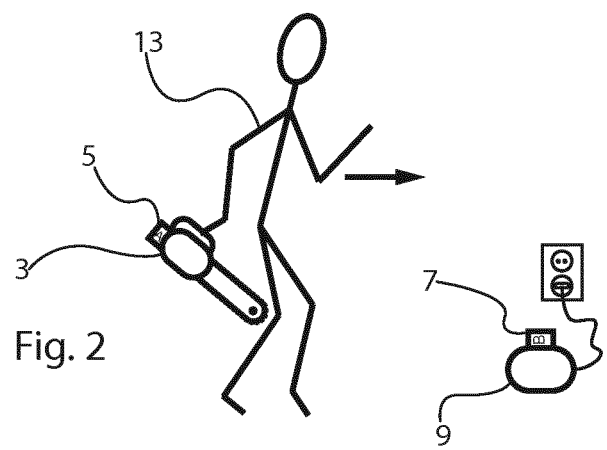
FIGS. 2-6 illustrate a use scenario according to the present disclosure.
Figure 3:
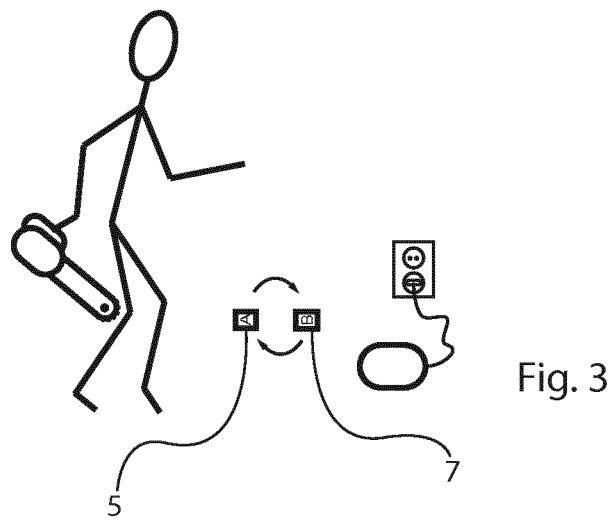

FIGS. 2-6 illustrate a use scenario according to the present disclosure. As shown in FIG. 2, a user 13, having exhausted a first chargeable battery 5 connected to his tool 3, approaches the charger 9 where a second battery 7 is inserted and has been charged. In FIG. 3, the user 13 swaps the batteries 5, 7, to insert the first battery 5 in the charger 9 and the second battery 7 in the tool.

When the first battery 5 is connected to the charger 9, an estimation is made of the charging time necessary for the first battery 5 to become charged to a predetermined charging level. The charging time needed depends on the status of the battery 5 and the status of the charger 9 as will be described.

Figure 4:
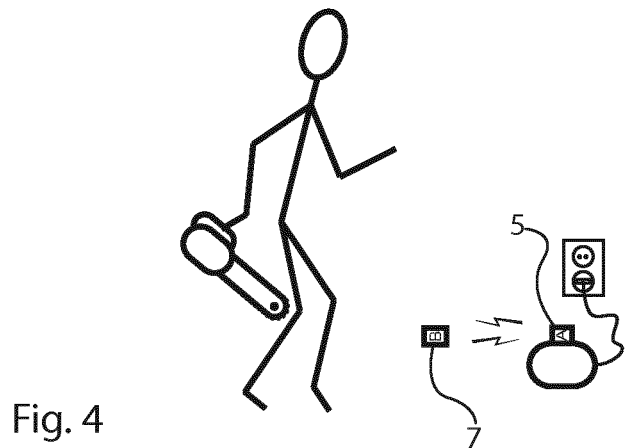

As illustrated in FIG. 4, the first battery 5 may communicate this estimated charging time to the second battery 7 using a short range wireless connection. Other alternatives exist for this communication as will be described.

Figure 5:
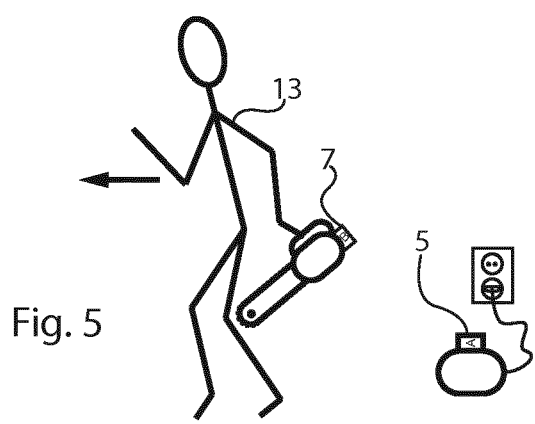

In FIG. 5, the communication has been completed and the second battery 7 has been connected to the tool 3. The user 13 now distances himself from the charging station to work with the tool 3.

Figure 6:
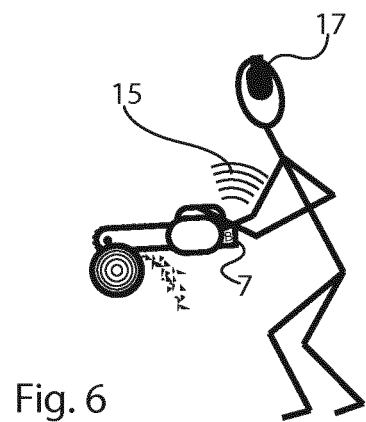

In FIG. 6, the user 13 operates the tool 3. The second battery 7 keeps track on when the first battery (not shown) is fully charged. Therefore, even though the user 13 is way out of the range of the communication from the charging station where the first battery is charged, an indication 15 to the user 13 that the first battery is fully charged, or about to be, may be provided.

Figure 8:
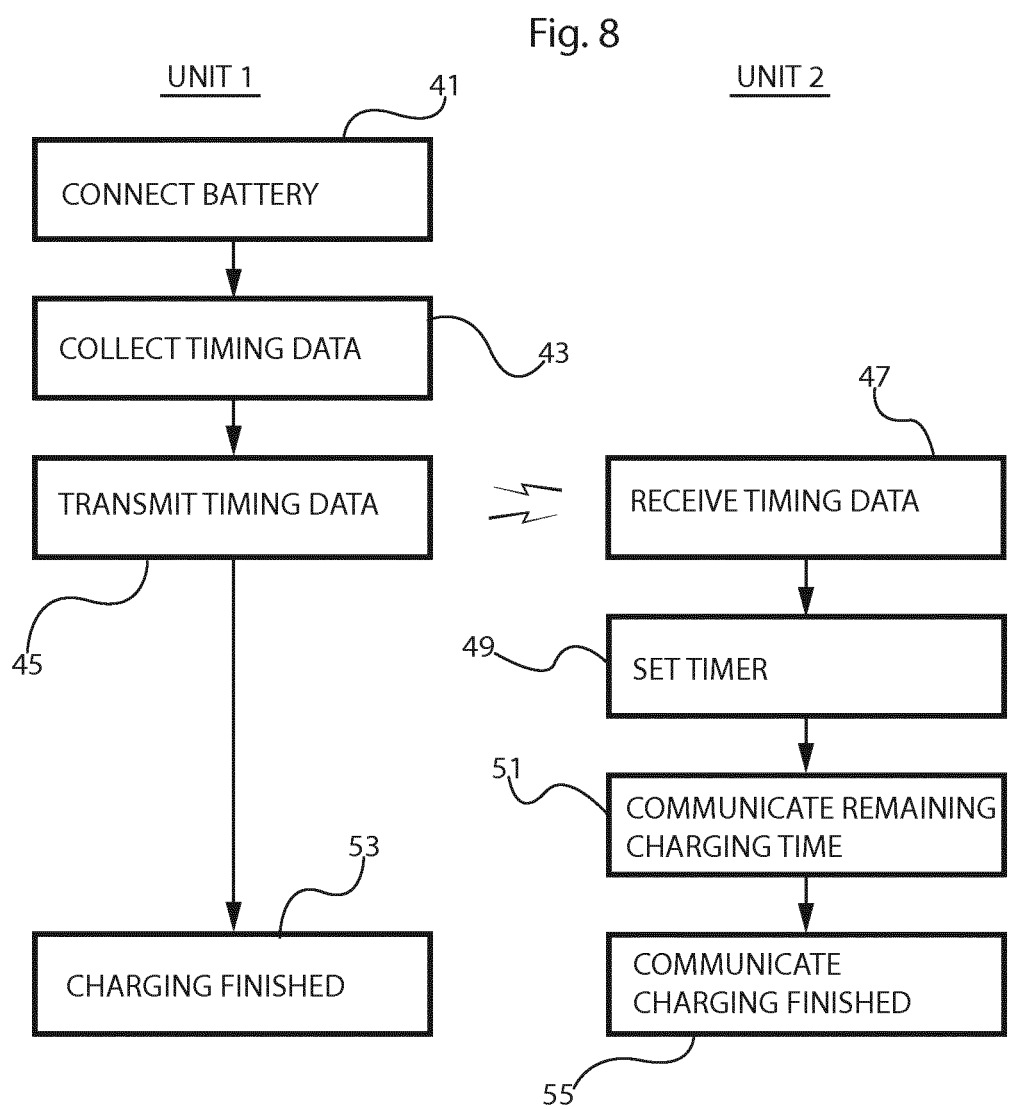
FIG. 8 is a flow chart illustrating a method in a battery charging system.

With reference to FIG. 8, a flow chart illustrating a method in a battery charging system, is disclosed. Briefly, the method begins with the charging 41 of a first battery being initiated. When this is done, it can be assumed that the user is still in the vicinity of the charging station, although this can also be verified. When charging begins, timing data is collected 43 relating to the charging of the first chargeable battery. The timing data is intended to be used to calculate the remaining time until the battery is charged to a predetermined level, e.g. 80% of its maximum capacity. Typical timing data may include a few of the following parameters: charging voltage (indicating how full the battery is), charging current (indicating charging speed), battery type, charger type, battery temperature, charger cooling status, etc.

This timing data may be transmitted 45 via a wireless interface to be received 47 in a remote unit.

It may be preferred to first carry out an estimation of said remaining charging time based on some of the abovementioned parameters, and instead transmitting the estimated remaining charging time as finalized timing data. Optionally, the reception may be acknowledged by the remote unit.

Transmission may typically be carried out with radio interfaces such as defined in standards like BLUETOOTH, ZIGBEE, IEEE 802.11, ANT+, etc. More generally, a personal area network, PAN, radio technology may be used, employing transceivers on both sides of the wireless interface. In principle, an infrared interface could be considered as well.

The steps described so far should be carried out before the user moves out of the range of the transmitter, but can easily be concluded within a few seconds. The timing data recording and the transmitting can be carried out in the battery that is charged, but an alternative location for those functions is in the charger.

There are options also for the remote unit. It would be possible to carry out the functions of that unit in the tool 3, the user's electronic earmuffs 17, cf. FIG. 6, or another wireless electronic device such as a cell phone (not shown) with a short range wireless interface. The most promising option is however to provide this functionality in the second battery 7 as that battery is very likely to be located in the vicinity of the first battery 5 and the charger 9 when charging of the first battery 5 commences.

Another option is to receive the timing data for instance in the second battery 7 and carry out a secondary communication between that battery and e.g. the user's electronic earmuffs when an indication is to take place. The earmuffs may then produce an acoustic indication.

The remote unit may set 49 a timing circuit based on the timing data. Thanks to this, the remote unit is now capable of communicating an indication of remaining charging time to a user. This can be done in different ways. In a simple version, the remote unit simply produces 55 an indication, visually or acoustically, when the first battery is determined to be charged to the predetermined level. For instance, a flashing LED or a beeping sound may indicate that the first battery can now be used. Alternatively, the second device may communicate the time when the charging will be completed, e.g. "14:54 pm" as communicated for instance with a display, in which case a dedicated timer circuit is not needed. In such an example the timer circuit can thus be regarded as optional. In yet another alternative, a remaining time may be counted down 51. In any case, by the time charging of the first battery is finished 53, this information may have been passed on to the user.

Needless to say, it would be possible to use this information in further ways. For instance, the user could be informed about the remaining energy level in the presently used battery together with the remaining charging time of the first battery so as to allow the user to plan his work accordingly. In even further evolved embodiments, the power consumption of the tool could even be limited to make sure that the presently used battery lasts until the first battery reaches a predetermined charging level. Other ways of altering or setting tool parameters are conceivable.

Figure 7:
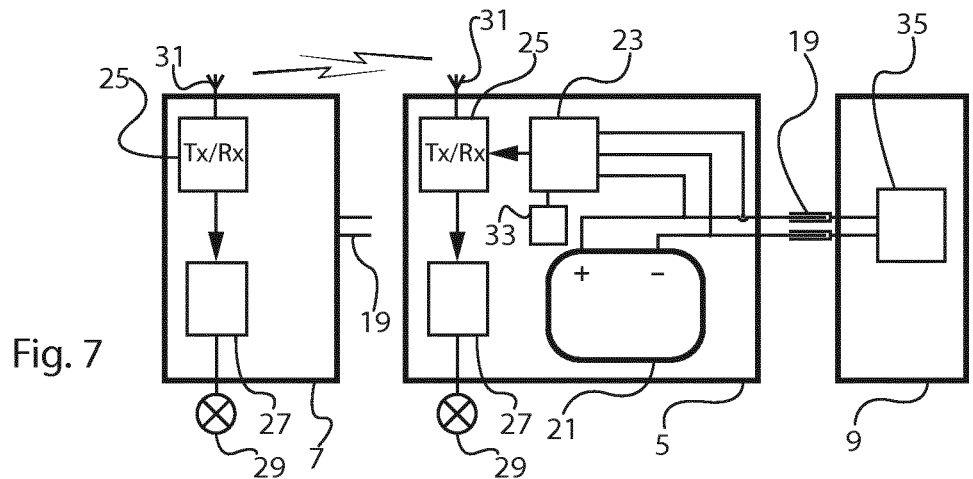
FIG. 7 shows a battery connected to a charger.

FIG. 7 shows a first battery 5 connected to a charger 9 by means of a connector 19. The charger 9 feeds a charging current to an accumulator 21 in the first battery 5. As illustrated, a timing data acquisition circuit 23 may determine the charging current and the charging voltage. Additionally, other sensors 33 may be used to record other parameters such as battery temperature. Further, conditions of the charger 35 that may influence the charging time may be recorded as well. In many cases, batteries communicate with chargers via dedicated control leads that may be used to this end.

The timing data acquisition circuit 23 may either calculate a remaining charging time itself and transmit that time via a transceiver 25 and antenna 31, or it may communicate the recorded parameters as such to allow another device to calculate the remaining charging time. The first alternative may require less information to be sent while the latter may be slightly faster.

In any case, the transmitted data is received by another unit, which in the illustrated case is an identical battery 7, although its accumulator, etc. are not shown. The other unit 7 may set a timer unit 27, and communicates an indication, as discussed above, for instance using a LED lamp 29. The first battery 5 may comprise such circuits as well, as illustrated.

The present disclosure is not limited to the above-described examples, and may be varied and altered in different ways within the scope of the appended claims. For instance, the battery charging system could involve more than two batteries. In principle, only one battery could also be used if the tool has an alternative source of energy.

The invention claimed is:

1. A battery charging system comprising:
    a first chargeable battery;
    a battery charger;
    a timing data acquisition circuit configured to:
        be activated when the first chargeable battery is connected to the battery charger, and
        obtain timing data related to charging of the first chargeable battery;
    a transmitter configured to send the timing data via a wireless interface;
    a remote unit comprising a receiver configured to wirelessly receive the timing data and keep track of a remaining charging time needed to charge the first chargeable battery based on the timing data after the remote unit is out of communication range with the transmitter; and
    a communicator at the remote unit configured to output an indication, for a user, corresponding to the remaining charging time needed to charge the first chargeable battery after the remote unit is out of communication range with the transmitter.

2. The battery charging system according to claim 1, wherein the timing data acquisition circuit is configured to estimate the remaining charging time needed to charge the first chargeable battery to a predetermined level, the transmitter being configured to send timing data corresponding to the estimated time period.

3. The battery charging system according to claim 1, wherein the system comprises a second chargeable battery, and the timing data acquisition circuit and the transmitter are located in the first chargeable battery, while the receiver, a timer circuit of the remote unit configured to keep track of the remaining charging time, and the communicator are located in the second chargeable battery.

4. The battery charging system according to claim 3, wherein the first chargeable battery comprises the timing data acquisition circuit, the transmitter, a first chargeable battery receiver, a first chargeable battery timer circuit, and a first chargeable battery communicator.

5. The battery charging system according to claim 1, wherein the first chargeable battery comprises the timing data acquisition circuit and a second chargeable battery comprises a second timing data acquisition circuit;
    wherein the transmitter is located in the first chargeable battery;
    wherein the receiver, the timer circuit and the communicator are located in a wireless device other than the second chargeable battery.

6. The battery charging system according to claim 1, wherein the timing data acquisition circuit and the transmitter are located in the charger.

7. The battery charging system according to claim 1, wherein the remote unit is included in a tool.

8. The battery charging system according to claim 1, wherein the transmitter and receiver operate a short-range wireless interface selected from a group comprising: BLUETOOTH, ZIGBEE, and ANT+.

9. The battery charging system according to claim 1, wherein the indication corresponding to the remaining charging time indicates that the first chargeable battery has reached a predetermined charging level.

10. The battery charging system according to claim 1, wherein the indication corresponding to the remaining charging time indicates when the first chargeable battery will reach a predetermined charging level.

11. The battery charging system according to claim 1, wherein the indication corresponding to the remaining charging time indicates the remaining charging time.

12. A device for a battery charging system comprising:
    a timing data acquisition circuit configured to:
        be activated when a first chargeable battery is connected to a battery charger, and
        collect timing data related to charging the first chargeable battery; and
    a transmitter configured to send the timing data via a wireless interface to a remote unit to enable the remote unit to keep track of, and output an indication of, a remaining charging time needed to charge the first chargeable battery based on the timing data after the remote unit has moved out of communication range with the transmitter.

13. A device in a battery charging system comprising:
    a receiver configured to receive timing data corresponding to a time period needed to charge a first chargeable battery to a predetermined level;
    a timer circuit configured to keep track of a remaining charging time needed to charge the first chargeable battery after the device has moved out of communication range with a transmitter that provided the timing data; and
    a communicator configured to output an indication, for a user, corresponding to a remaining charging time needed to charge the first chargeable battery after the device is out of communication range with the transmitter.

14. A method implemented by a battery charging system, the battery charging system comprising a first chargeable battery, a second chargeable battery, and a battery charger, the method comprising:
    collecting timing data related to charging of the first chargeable battery, in response to the first chargeable battery being connected to the battery charger;
    transmitting, by a transmitter, the timing data via a wireless interface;
    receiving, via the wireless interface, the timing data in a remote circuit;
    keeping track, at the remote circuit, of a remaining charging time needed to charge the first chargeable battery based on the timing data after the remote circuit has moved out of communication range with the transmitter; and
    outputting, at the remote circuit and to a user, an indication corresponding to the remaining charging time needed to charge the first chargeable battery after the remote unit is out of communication range with the transmitter.

15. The method according to claim 14, wherein the outputting takes place in response to the remote circuit having moved out of communication range of the tansmitter.

16. The method according to claim 14, wherein a tool parameter is set based on the received timing data.

17. The devices of claim 13, wherein the device comprises a second chargeable battery.

18. The method of claim 14 wherein the outputting is provided to the user via a communicator of a second chargeable battery.

\* \* \* \* \*